United States Patent [19]

Watley et al.

[11] Patent Number: 4,775,828
[45] Date of Patent: Oct. 4, 1988

[54] POWER LEVEL INDICATOR FOR AN ELECTRIC GENERATOR

[75] Inventors: L. Dale Watley, Hastings; Kenneth M. Frank; Douglas A. Nichols, both of Kearney, all of Nebr.

[73] Assignee: Ag-Tronic, Inc., Kearney, Nebr.

[21] Appl. No.: 858,755

[22] Filed: May 2, 1986

[51] Int. Cl.⁴ .............................................. H02J 3/50
[52] U.S. Cl. .......................................... 322/7; 322/25; 322/99; 320/48; 324/158 MG
[58] Field of Search ................ 322/7, 25, 99; 320/48; 324/99 R, 76 A, 158 MG

[56] References Cited

U.S. PATENT DOCUMENTS 3,215,935 11/1965 Mead, Jr. et al. .......... 324/158 MG
3,617,853 11/1971 Kawashima et al. ............. 322/99 X
3,656,044 4/1972 King ................................. 322/1 X
4,070,624 1/1978 Taylor ............................ 322/99 X
4,092,591 5/1978 Lozowski ....................... 324/115 X
4,459,548 7/1984 Lentz et al. ................. 324/158 MG
4,583,036 4/1986 Morishita et al. ................ 320/48 X

OTHER PUBLICATIONS

Mims, "Engineer's Notebook", 1979, Radio Shack, p. 110.
Allied Electronics, 1979 Engineering Manual, p. 98.
Hewlett Packard 1969 Electronics Catalog, pp. 202, 204.

Primary Examiner—Patrick R. Salce
Assistant Examiner—Anita M. Ault
Attorney, Agent, or Firm—Zarley, McKee, Thomte, Voorhees & Sease

[57] ABSTRACT

A power level indicator is described for use with an electric generator for indicating to the operator the percentage of the total power available from the generator which is being consumed by a load.

4 Claims, 2 Drawing Sheets

POWER LEVEL INDICATOR FOR AN ELECTRIC GENERATOR

BACKGROUND OF THE INVENTION

Electric generators of the engine driven type are only able to produce a certain amount of power which obviously varies depending upon the size and rating of the generator. If an electric generator is overloaded, the generator will normally lug down and will possibly blow a breaker or fuse or will kill the engine completely. An operator of an electric generator has no specific information available to him which indicates the amount of load being applied to the generator.

It is therefore a principal object of the invention to provide a power level indicator for an electric generator.

A further object of the invention is to provide a power level indicator for an electric generator which indicates to the operator the amount of load being applied to the electric generator in fifteen percent steps.

A further object of the invention is to provide a power level indicator for an electric generator which may be electrically connected to either the power winding in the generator or the winding of the battery charger of the generator, to supply operating power for the indicator.

Still another object of the invention is to provide a power level indicator for an electric generator which indicates to the operator that adding an additional load to the generator will overload the generator.

Yet another object of the invention is to provide a power level indicator for an electric generator which is comprised of seven light-emitting diodes, each of which are selectively illuminated depending upon the amount of power being consumed by a load.

These and other objects will be apparent to those skilled in the art.

SUMMARY OF THE INVENTION

Figure 1:
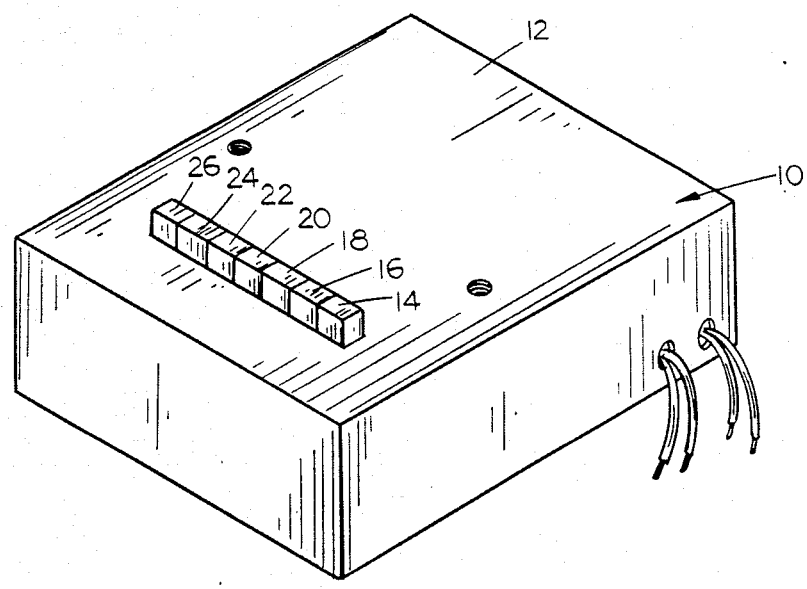
FIG. 1 is a perspective view of the power level indicator of this invention which is secured or mounted on an electric generator.
Figure 2:
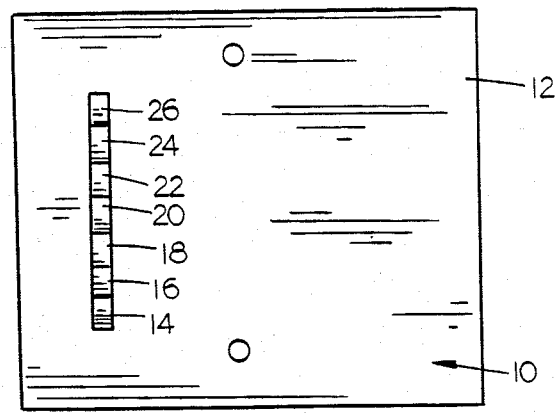
FIG. 2 is a top view of the power level indicator of FIG. 1.
Figure 3:
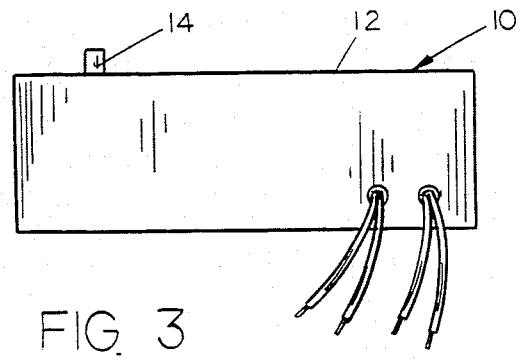
FIG. 3 is a side view of the power level indicator of FIGS. 1 and 2.
Figure 4:
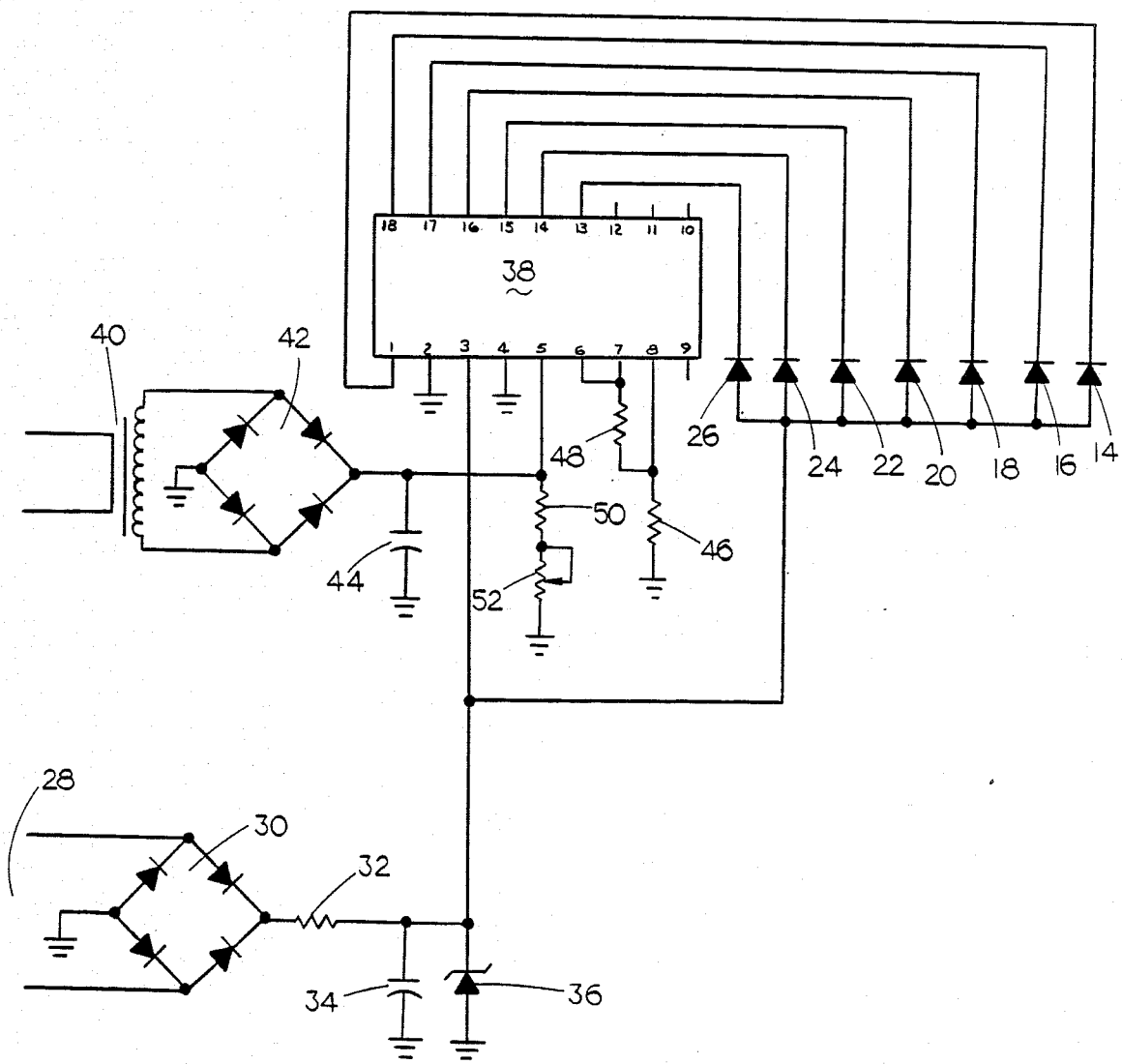
FIG. 4 is a schematic of the electrical circuitry of the invention.

A power level indicator for an electric generator is described. The power level indicator is either electrically connected to the power winding of the generator or to the winding of the battery charger. As load is applied to the generator, current begins to flow in a sense lead. The current flowing in the sense lead is ultimately reflected by the illumination of one of some seven light emitting diodes which approximately indicate 15 percent, 30 percent, 45 percent, 60 percent, 75 percent, 90 percent and 105 percent of the total power available from the generator which is being consumed by the load.

DESCRIPTION OF THE PREFERRED EMBODIMENT

The power level indicator of this invention is referred to generally by the reference numeral 10 and the circuitry thereof is contained in a housing 12 which is mounted on the electric generator. The housing 12 has seven light-emitting diodes protruding therefrom. For purposes of description, the light-emitting diodes will be indicated by the reference numerals 14, 16, 18, 20, 22, 24 and 26 which correspond to approximately 15%, 30%, 45%, 60%, 75%, 90% and 105% indication of the percentage of the total power available from the generator which is being consumed by the load.

Circuit power can be supplied to the power level indicator by two different means. The power may be supplied from the winding of the battery charger 28 or the power winding of the generator. The alternating current voltage from the battery charger 28 is rectified by the diode bridge 30. The rectified voltage is passed through a resistor 32 (100 ohm, ½ watt) and is filtered by a capacitor 34 (220 mfd, 25 v). The filter voltage is regulated by a 12 v zener diode 36. The (B+) voltage is then supplied to pin 3 of dot bar display driver 38 and to the anodes of the display light-emitting diodes 14, 16, 18, 20, 22, 24 and 26.

The current sense lead of transformer 40 is one power lead from the generator power winding. As the load is applied to the generator, a current begins to flow in the secondary winding of the transformer 40 proportional to the primary current. The primary current has a range of 0–30 amps. The secondary rectified voltage is zeroed at 0–7 vdc.

The secondary voltage is rectified by diode bridge 42 and filtered by capacitor 44 (47 mfd, 16 v). This analog voltage is compared to a series of seven comparators inside dot bar display driver 38, each of which is biased to a different comparison level. The input signal level, therefore, determines which of the light-emitting diodes will turn on. The reference voltage is set up by the combination of resistors 46 (3.3K) and 48 (1K). The input voltage is compared to this reference. Resistor 48 also determines the brightness of the light-emitting diodes. Resistor 50 (1K) and potentiometer 52 (2K) provide a means for calibrating the input analog to 15% steps. This must be adjusted for each different sized generator. Thus, if the load which is connected to the generator is consuming approximately 15% of a total available power of the generator, diode 14 will be illuminated. Light-emitting diodes 16, 18, 20, 22 and 24 will be individually illuminated as the load is increased on the generator. When light-emitting diode 24 is illuminated, the operator will know that the load is consuming approximately 90% of the total available power of the generator and that adding an additional load to the generator which exceed name plate rating possibly damage the generator or load. It should be noted that if for instance the 15% light is illuminated, the power being supplied will be approximately 15% of the total generator power capability. The next segment will only come on when approximately 30% of the total power is being consumed. Therefore, even though the 15% light is on, the generator may be producing 25% of the total available power.

Thus it can be seen that a novel power level indicator has been provided which accomplishes at least all of its stated objectives.

We claim:

1. In combination: An engine-driven A.C. electric generator with a substantially fixed voltage output; and a power output indicator for indicating remaining available output power, comprising, (a) a sensing transformer with a primary winding and a secondary winding, said primary winding being connected in series with the generator and a load, said secondary winding being connected in series with a rectifier and low pass filter so as to produce a D.C. voltage output proportional in amplitude to the A.C. electrical current flow from the generator, said primary and secondary windings of the sensing transformer being coupled so as to cause the voltage output of the secondary winding to decrease at a rate in substantially direct proportion to a decrease in generator output voltage as a consequence of increased current output from the generator to thereby compensate for a drop in voltage output of said generator at high current levels; and (b) a D.C. voltage sensitive meter means electrically connected to the low pass filter so as to provide a visual indication of the amount of power output being produced by the generator in comparison to its power output capacity.

2. The combination of claim 1, wherein the voltage sensitive meter means of said power output indicator is calibrated in terms of percentage of the maximum power output capacity of the generator.

3. The combination of claim 2, wherein the voltage sensitive meter means includes multiple light emitting diodes and a dot bar display driver to selectively illuminate one or more of the light emitting diodes in response to the D.C. voltage output of the rectifier and low pass filter.

4. The combination of claim 3, further comprising means for electrically adjusting the sensitivity of said voltage sensitive meter means, whereby the percentage calibration of the voltage sensitive meter may be adjusted for generators of different power or voltage outputs.

* * * * *